United States Patent
Pai et al.

(10) Patent No.: US 7,696,914 B2
(45) Date of Patent: Apr. 13, 2010

(54) SIGMA DELTA MODULATOR AND RELATED METHOD THEREOF

(75) Inventors: Hung-Chuan Pai, Irvine, CA (US); Chao-Tung Yang, Tai-Nan (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 0 days.

(21) Appl. No.: 12/179,556

(22) Filed: Jul. 24, 2008

(65) Prior Publication Data
US 2009/0033533 A1 Feb. 5, 2009

(30) Foreign Application Priority Data
Jul. 30, 2007 (TW) .............. 96127727 A (51) Int. Cl.
*H03M 3/00* (2006.01)
(52) U.S. Cl. ............... 341/143; 341/144
(58) Field of Classification Search ........ 341/143, 341/155, 144, 118, 120
See application file for complete search history.

(56) References Cited

U.S. PATENT DOCUMENTS

| | | | |
|---|---|---|---|
| 6,693,573 B1 * | 2/2004 | Linder | 341/143 |
| 7,288,946 B2 * | 10/2007 | Hargreaves et al. | 324/678 |
| 7,362,252 B1 * | 4/2008 | Pai | 341/143 |
| 7,545,303 B1 * | 6/2009 | Silva et al. | 341/143 |

OTHER PUBLICATIONS

Kathleen Philips, A Continuous- Time ΣΔ ADC With Increased Immunity to Interferers, IEEE Journal of Solid-State Circuit, Dec. 2004, p. 2170-2178, vol. 39, No. 12.

* cited by examiner

*Primary Examiner*—Peguy JeanPierre
(74) *Attorney, Agent, or Firm*—Winston Hsu (57) ABSTRACT

A sigma-delta modulator includes a loop filter, a single bit quantizer, a single bit DAC, an adder. The loop filter is for filtering a summed signal to generate a filtered signal. The single bit quantizer is coupled to the loop filter, for performing a quantization process to the filtered signal to generate a quantized signal. The single bit DAC is coupled to the single bit quantizer, has an adjustable configuration, and is for generating a feedback signal according to the quantized signal and the configuration thereof. The adder is coupled to the loop filter and the single bit DAC, for summing an input signal and the feedback signal to generate the summed signal.

8 Claims, 8 Drawing Sheets

SIGMA DELTA MODULATOR AND RELATED METHOD THEREOF

BACKGROUND OF THE INVENTION

1. Field of the Invention

The present invention relates to a sigma delta modulator, and particularly relates to a sigma delta modulator which utilizes a DAC capable of changing configuration.

2. Description of the Prior Art

Figure 1A:
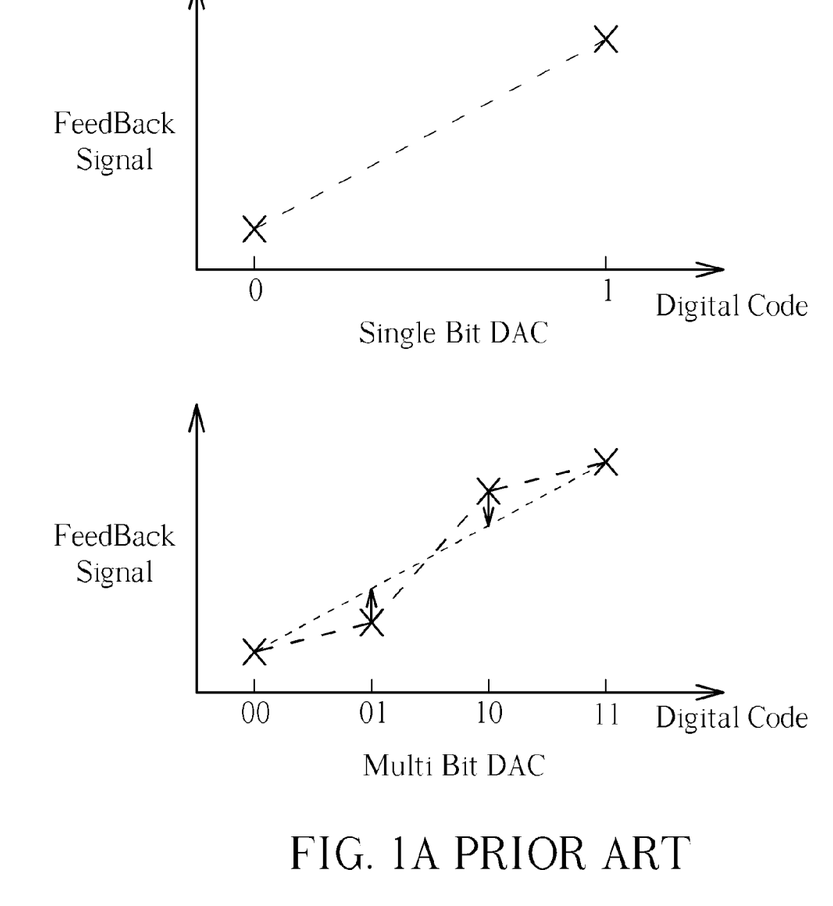
FIG. 1A illustrates the linearity guaranteed single bit DAC and the non-linearity of a prior art multi bit DAC.

In the field of signal processing, a sigma delta modulator is often used for processing a signal. Sigma delta modulators can be classified into many types: continuous time, discrete time, one order or multi orders, single bit or multi bits. Normally, if it is desired to increase the dynamic range of an input signal, the number of order or bit of the sigma delta modulator should increase correspondingly. However, the state will be unstable if the number of order keeps increasing, and a non-linear feedback signal is introduced if the number of bit goes high and no extra processing is performed, such that the summed signal becomes non-linear, and results in decreased system linearity. FIG. 1A illustrates the linearity guaranteed single bit DAC and the non linearity of a prior art multi bit DAC. As shown in FIG. 1A, a feedback signal generated from a single bit DAC must be linear, but a multi bit DAC tends to generate a non-linear feedback signal. In this situation, extra algorithms or circuits are needed to maintain or rectify linearity, and as such, additional burden of the system may be needed.

Some sigma delta modulators will change the configuration of the devices to adjust their gain.

Figure 1B:
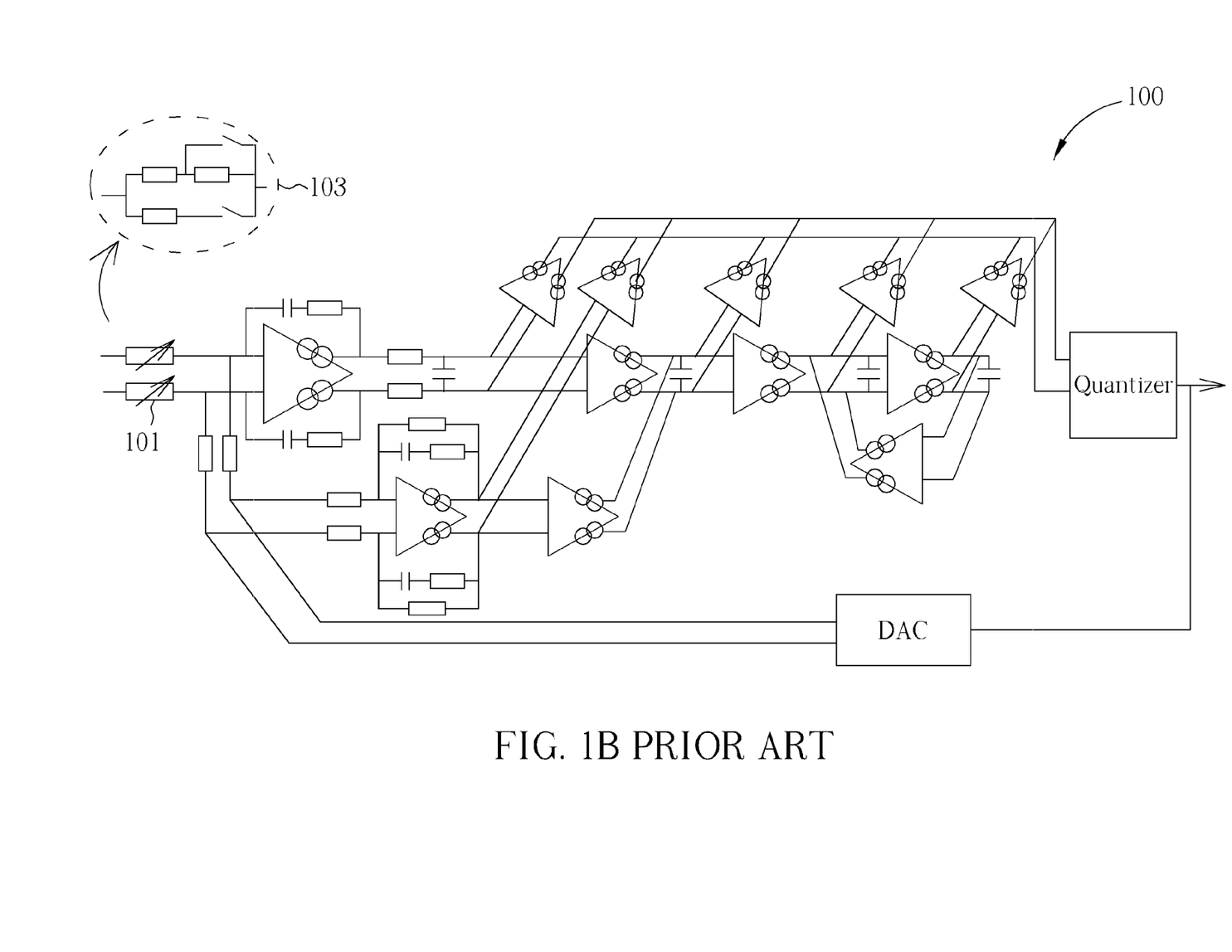
FIG. 1B illustrates a prior art sigma delta modulator.

FIG. 1B illustrates a prior art sigma delta modulator 100, which is disclosed in Kathleen Philips, etc., "A Continuous-Time ΣΔADC With Increased Immunity to Interferers," 2004 IEEE Journal of Solid-State Circuits, vol. 39, no. 12, pp 2170-2177. As shown in FIG. 1B, the sigma delta modulator 100 comprises a plurality of variable resistors 101 for adjusting gain of the sigma delta modulator 100. The variable resistor 101 is on the input signal path, which is shown as the variable resistor module 103 in FIG. 1B and the resistance value thereof is based on switch on-off status and is signal dependent. Therefore, the non-constant switch resistance will cause the signal to become non-linear, and thereby result in system distortion. The detailed description of other devices is already disclosed in the paper mentioned above, and thus is omitted for brevity.

SUMMARY OF THE INVENTION

Therefore, one objective of the present invention is to provide a sigma delta modulator and related method thereof, such that the capacitance, resistance, current or voltage of the DAC can be controlled and the feedback signal can be adjusted accordingly, to solve the above-mentioned problems.

An embodiment of the present invention provides a sigma delta modulator, comprising: a loop filter, for filtering a summed signal to generate a filtered signal; a single bit quantizer, coupled to the loop filter, for performing a quantization process to the filtered signal to generate a quantized signal; a single bit adjustable DAC, coupled to the single bit quantizer, including an adjustable configuration and for generating a feedback signal according to the quantized signal and the configuration; and an adder, coupled to the loop filter and the single bit adjustable DAC, for summing an input signal and the feedback signal to generate the summed signal.

Another embodiment of the present invention provides a signal modulation method, comprising: (a) filtering a summed signal to generate a filtered signal; (b) performing a quantization process to the filtered signal for generating a quantized signal; (c) providing a single bit adjustable DAC, which includes an adjustable configuration, and is used for generating a feedback signal according to the quantized signal and the configuration; and (d) summing an input signal and the feedback signal to generate the summed signal.

According to above mentioned structures and methods, configuration of a DAC can be adjusted according to requirements, and other advantages are also provided, which will be described below.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
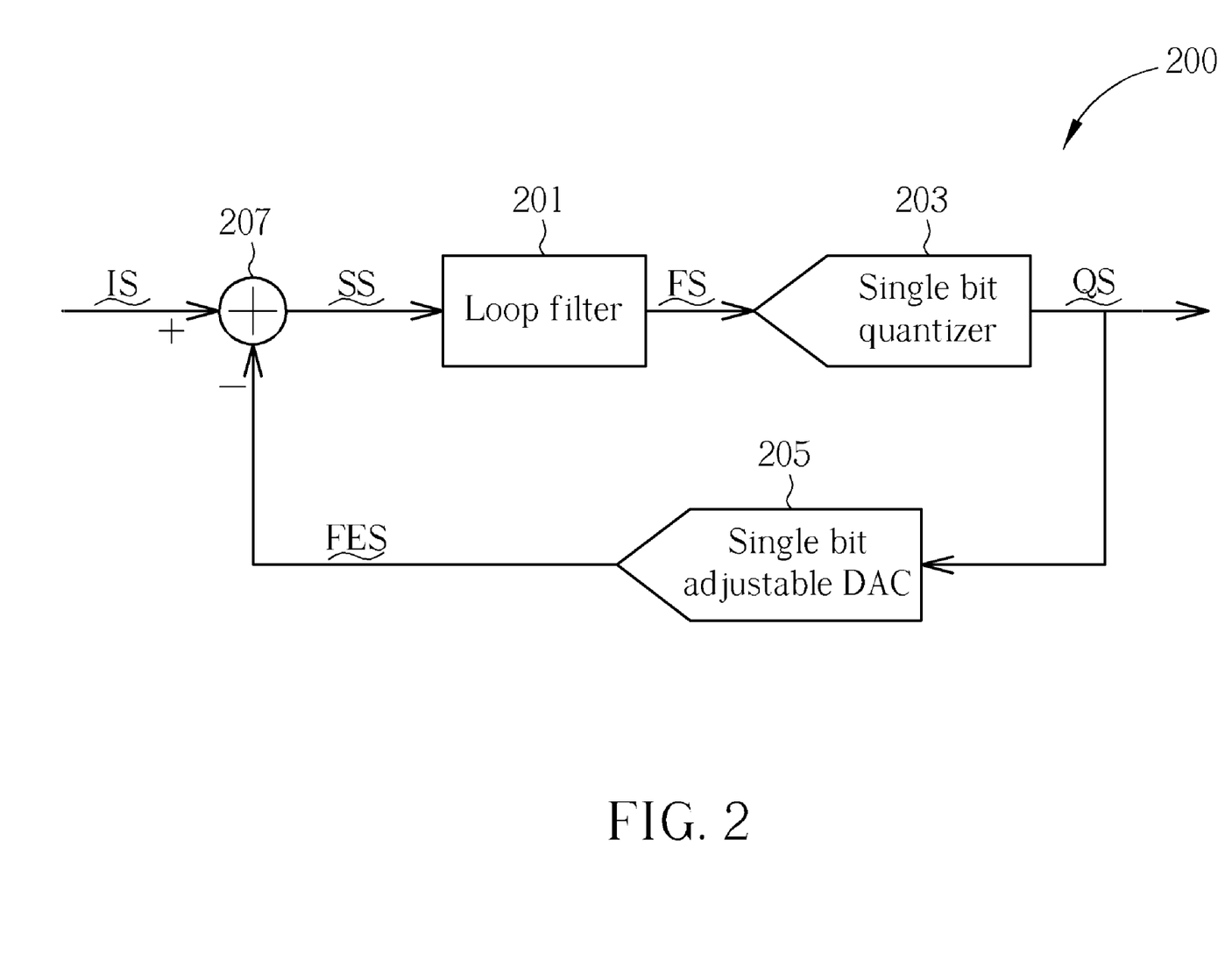
FIG. 2 is a sigma delta modulator according to an embodiment of the present invention.

FIG. 2 is a sigma delta modulator 200 according to an embodiment of the present invention. As shown in FIG. 2, the sigma delta modulator 200 includes a loop filter 201, a single bit quantizer 203, a single bit adjustable DAC 205 and an adder 207. The loop filter 201 is used for filtering a summed signal SS to generate a filtered signal FS. The single bit quantizer 203 is used for performing a quantization process to the filtered signal FS for generating a quantized signal QS. The single bit adjustable DAC 205 includes an adjustable configuration and is for generating a feedback signal FES according to the quantized signal QS and the configuration. The adder 207 is used for summing an input signal IS and the feedback signal FES to generate the summed signal SS. Normally, the single bit quantizer 203 is coupled to a digital filter or a decimation filter, but it is not meant to limit the present invention.

As known to persons skilled in the art, the sigma delta modulator often includes an integrator to integrate the summed signal to get rid of a high frequency or noise composition, such that the quality of the signal is improved. The above-mentioned loop filter 201 can be utilized as an integrator.

According to the above-mentioned structure, the capacitor, resistor, current or voltage of the single bit adjustable DAC 205 can be adjusted as desired to adjust the configuration thereof. Compared with the structure shown in FIG. 1B, the embodiment of FIG. 2 adjusts the configuration of the single bit adjustable DAC 205, and the single bit adjustable DAC 205 is not on the input signal path (that is, not on the path of the input signal IS), the drawbacks in the prior art circuit can be avoided. Some embodiments showing the detail structures of the single bit adjustable DAC 205 are described as follows. Also, since the detailed operation and relation between the loop filter 201, the single bit quantizer 203, the single bit adjustable DAC 205 and the adder 207 are well known by persons skilled in the art, they are omitted for brevity.

Figure 3:
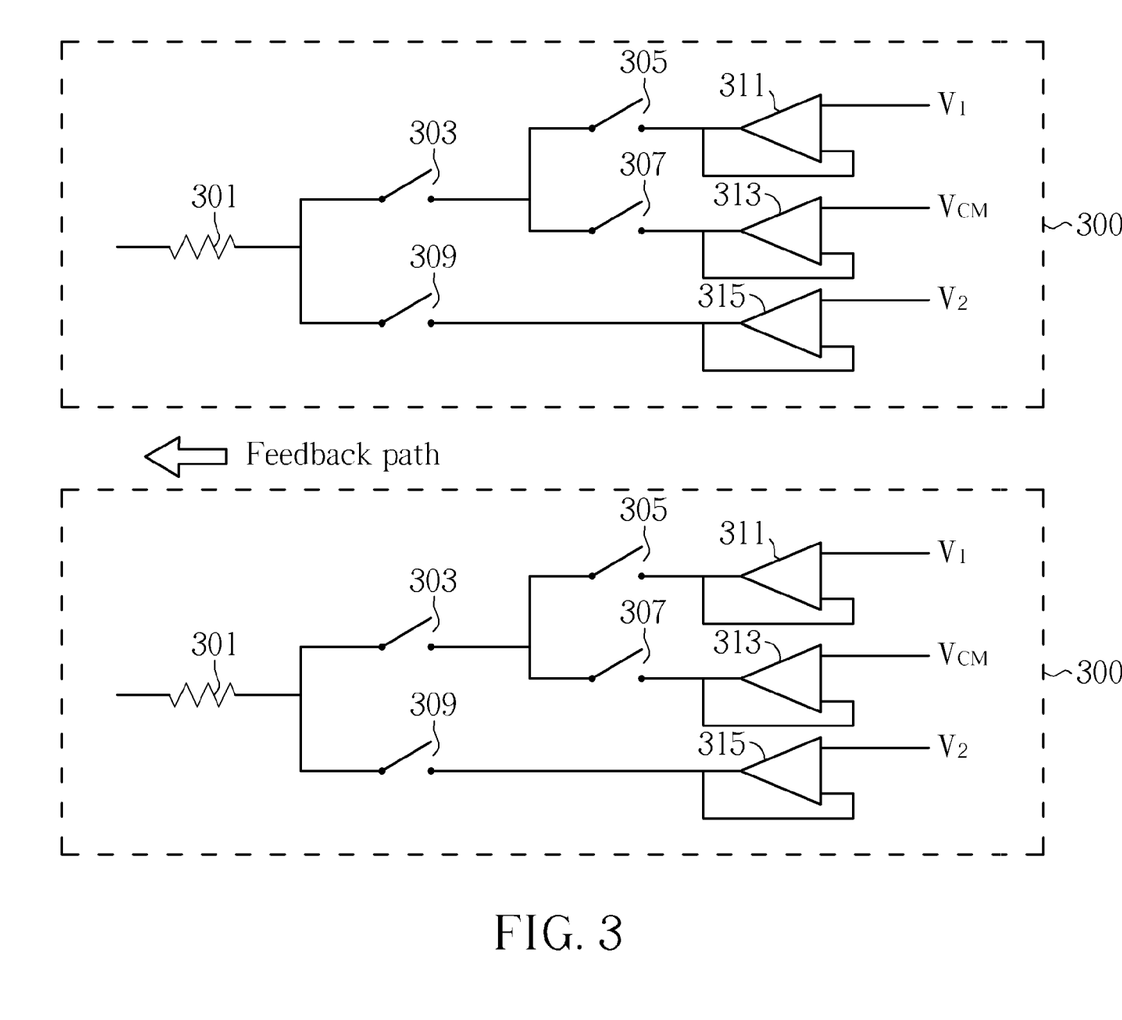
FIGS. 3-5 illustrates embodiments of detail structures of a single bit adjustable DAC shown in FIG. 2.
Figure 4:
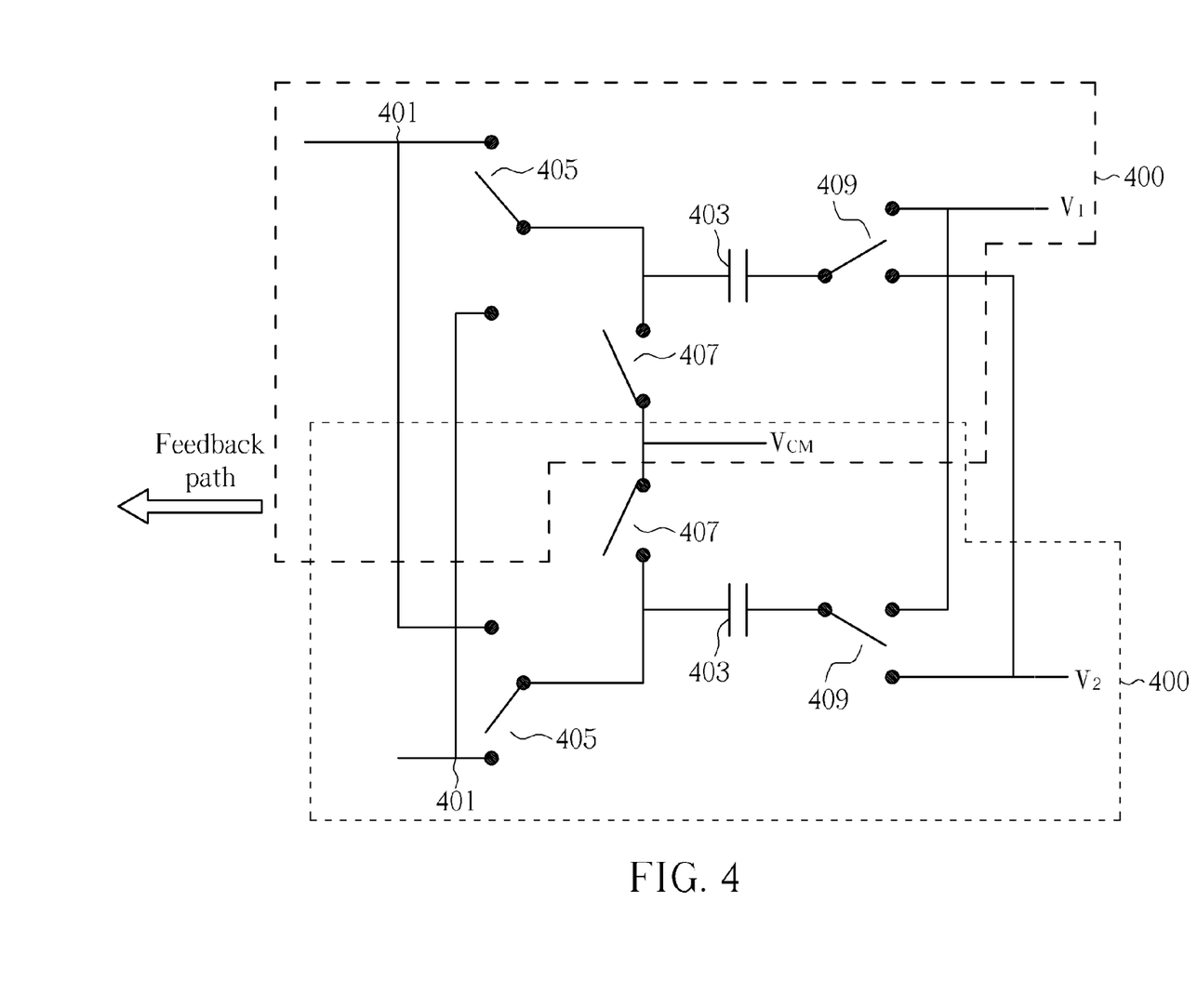
Figure 5:
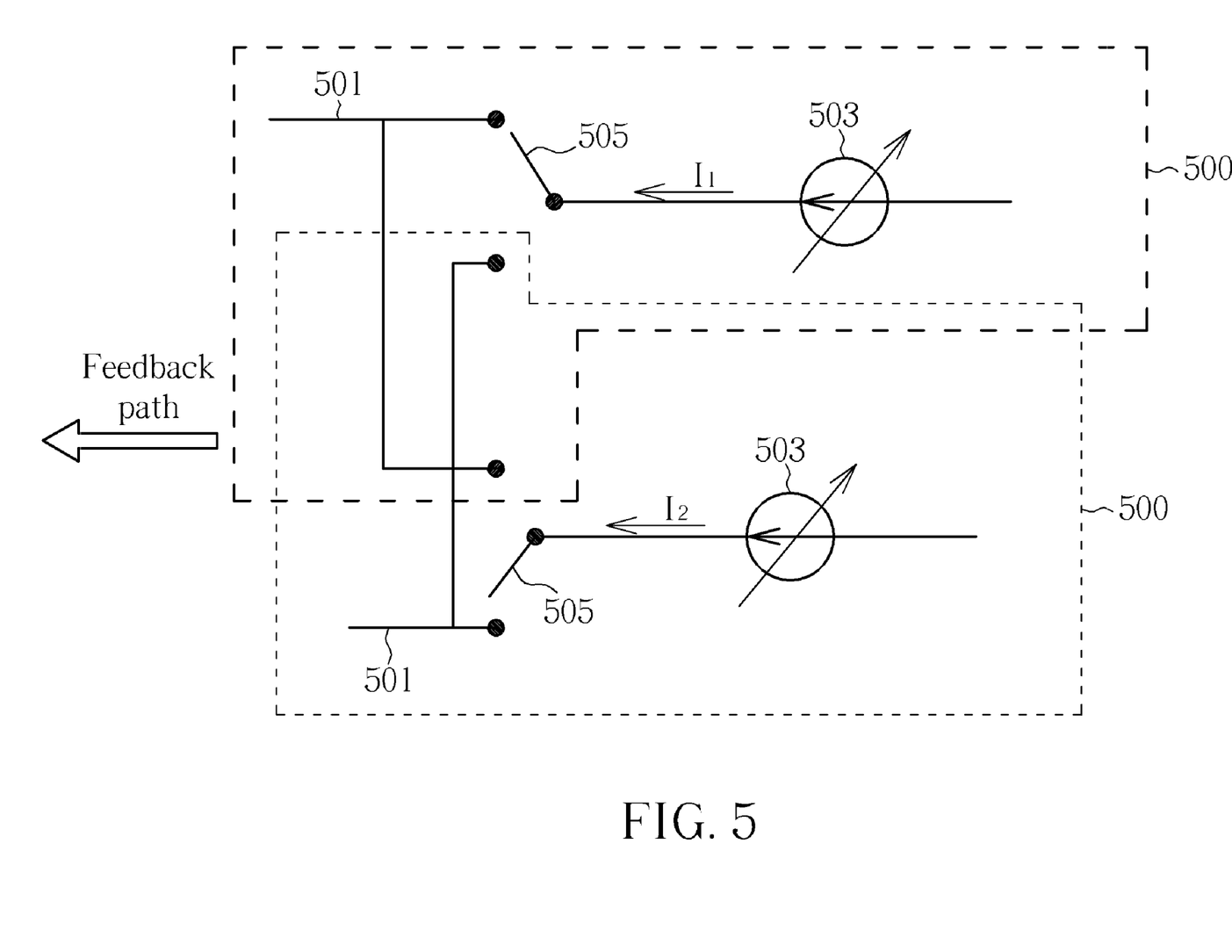

FIGS. 3-5 illustrate embodiments of the detailed structures of the single bit adjustable DAC 205 shown in FIG. 2. Please jointly refer to FIG. 2 and FIGS. 3-5 to understand the present invention more clearly. As shown in FIG. 3, the single bit adjustable DAC 205 includes two configuration setting circuits 300, each having a resistor 301, a first switch 303, a second switch 305, a third switch 307 and a fourth switch 309. The second switch 305 is coupled to the first switch 303 and a first voltage $V_1$. The third switch 307 is coupled to the first switch 303 and a common voltage $V_{CM}$. The fourth switch 309 is coupled to the resistor 301 and a second voltage $V_2$. The first switch 303, the second switch 305, the third switch 307 and the fourth switch 309 operate according to the quantized signal QS. Also, at least one of the resistor 301, the first voltage $V_1$, the common voltage $V_{CM}$ and the second voltage $V_2$ is adjustable. The first voltage $V_1$ and the common voltage $V_{CM}$, and the second voltage $V_2$ and the common voltage $V_{CM}$ respectively form the reference voltage of the single bit adjustable DAC 205. By controlling the operation of the first switch 303, the second switch 305, the third switch 307 and the fourth switch 309, and values of the resistor 301, the first voltage $V_1$, the common voltage $V_{CM}$, and the second voltage $V_2$, the feedback signal FES can be generated as desired to the feedback path.

It should be noted that the embodiment shown in FIG. 3 further provides voltage unity gain (that is, a gain of 1) amplifiers 311, 313 and 315 coupled between the first switch 303, the second switch 305, the third switch 307 and the fourth switch 309, the first voltage $V_1$, the common voltage $V_{CM}$ and the second voltage $V_2$ as buffers. As known to persons skilled in the art, the voltage unity gain amplifiers 311, 313 and 315 can be utilized as buffers for isolating the loading and the input signal to provide high input and low output impedance, thereby increasing the performance of the circuit. However, it does not mean that the single bit adjustable DAC 205 according to the present invention must include the voltage unity gain amplifiers 311, 313 and 315.

In the embodiments shown in FIG. 3, the feedback signal FES is outputted from two differential output terminals, thus two configuration setting circuits 300 are needed to output two signals for forming a feedback signal FES, but it is not meant to limit the present invention. If the single bit adjustable DAC 205 includes only an output terminal, the embodiment shown in FIG. 3 can include only one configuration setting circuit 300.

In FIG. 4, the single bit adjustable DAC 205 includes two configuration setting circuits 400, each having an output path 401, a capacitor 403, a first switch 405, a second switch 407 and a third switch 409. The output path 401 is coupled to the adder 207. The first switch 405 is coupled to the output path 401 and the capacitor 403. The second switch 407 is coupled to a common voltage $V_{CM}$ and the capacitor 403. The third switch 409 is coupled to the capacitor 403 and a voltage $V_1$ or $V_2$. The first switch 405, the second switch 407, and the third switch 409 operate according to the quantized signal QS, and at least one of the capacitor 403, the common voltage $V_{CM}$ and the voltages $V_1$ and $V_2$ is adjustable. Also, the voltage values of voltage $V_1$ and $V_2$ are different. In this embodiment, voltages $V_1$, $V_2$ and the common voltage $V_{CM}$ also form a reference voltage of the single bit adjustable DAC 205.

Similarly, in the embodiment shown in FIG. 4, the feedback signal FES of the single bit adjustable DAC 205 is outputted from two differential output terminals, and thus, two configuration setting circuits 400 are needed to output two signals as the feedback signal FES. These two configuration setting circuits 400 can be coupled to the voltages ($V_1$ or $V_2$) or the output paths of each other, but it is not a limit to the present invention. If the single bit adjustable DAC 205 includes only an output terminal, the embodiment shown in FIG. 4 can include only one configuration setting circuit 400.

In the embodiment shown in FIG. 5, the single bit adjustable DAC 205 includes two configuration setting circuit 500, each having an output path 501, an adjustable current source 503 (with different current values $I_1$ or $I_2$) and a switch 505. The output path 501 is coupled to the adder 207, and the switch 505 is coupled to the adjustable current source 503 and the output path 501.

Similarly, in the embodiment shown in FIG. 5, the feedback signal FES of the single bit adjustable DAC 205 is outputted from two differential output terminals. Thus, two configuration setting circuits 500 are needed to output two signals as the feedback signal FES, and these two configuration setting circuits 500 can be coupled to the output paths of each other, but it is not a limit to the present invention. If the single bit adjustable DAC 205 includes only an output terminal, the embodiment shown in FIG. 5 can include only one configuration setting circuit 500.

Figure 6:
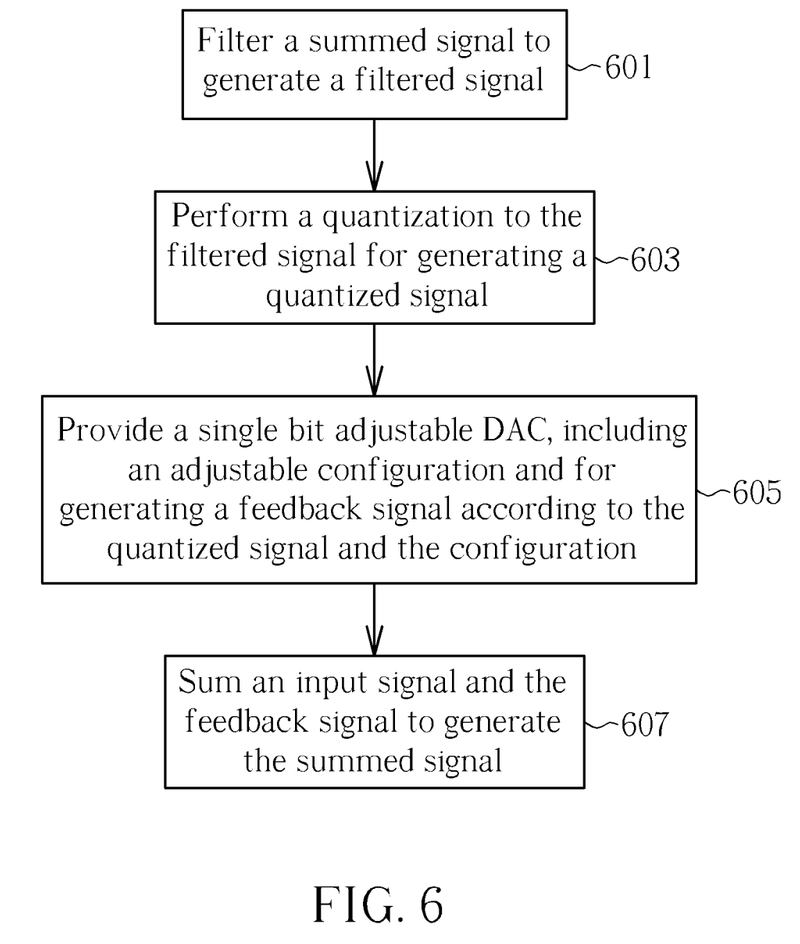
FIG. 6 illustrates a signal modulation method corresponding to the structures shown in FIGS. 2-5.

FIG. 6 illustrates a signal modulation method corresponding to the structures shown in FIGS. 2-5. This method includes:

Step 601

Filter a summed signal SS to generate a filtered signal FS.

Step 603

Perform a quantization process to the filtered signal FS for generating a quantized signal QS.

Step 605

Provide a single bit adjustable DAC, which includes an adjustable configuration and generates a feedback signal FES according to the quantized signal QS and the configuration.

Step 607

Sum an input signal IS and the feedback signal FES to generate the summed signal SS.

If this method corresponds to the embodiment shown in FIG. 3, the step 605 further: provides a resistor, a first voltage, a common voltage and a second voltage as part of the single bit adjustable DAC; provides one of the first voltage, the common voltage and the second voltage to the resistor according to the quantized signal QS; and utilizes the resistor, the first voltage, the common voltage and the second voltage to generate the feedback signal FES; wherein at least one of the resistor, the first voltage, the common voltage and the second voltage is adjustable.

If this method corresponds to the embodiment shown in FIG. 4, the step 605 further: provides a capacitor, a common voltage and a first voltage ($V_1$ or $V_2$) as part of the single bit adjustable DAC; and utilizes the capacitor, the common voltage and the first voltage ($V_1$ or $V_2$) for generating the feedback signal FES according to the quantized signal QS; wherein at least one of the capacitor, the common voltage and the first voltage ($V_1$ or $V_2$) is adjustable.

If this method corresponds to the embodiment shown in FIG. 5, the step 605 further provides an adjustable current source ($I_1$ or $I_2$) as part of the single bit adjustable DAC, and utilizes the adjustable current source to generate the feedback signal FES according to the quantized signal QS.

According to abovementioned structure and method, the configuration of the DAC can be adjusted as desired. Such a mechanism includes the following advantages: the dynamic range of the input signal of the sigma delta modulator can be extended; the switch is not on the signal path, so signal distortion can be avoided; since a single bit includes only two possible values, and two points certainly constitute a line, the single bit adjustable DAC can abbreviate the linearity enhancing algorithm and the hardware thereof, which are required by a multi bit DAC, and a potential non-linearity problem can be avoided; such a sigma delta modulator can be utilized as an auto gain control (AGC); the single bit DAC can be a structure of continuous signals or discrete signals, thereby increasing the application range of the circuit. If the quantization unit is coupled to the decimation filter, such a mechanism can maintain a bit stream output, which is good for simplifying the design of a decimation filter.

Figure 7:
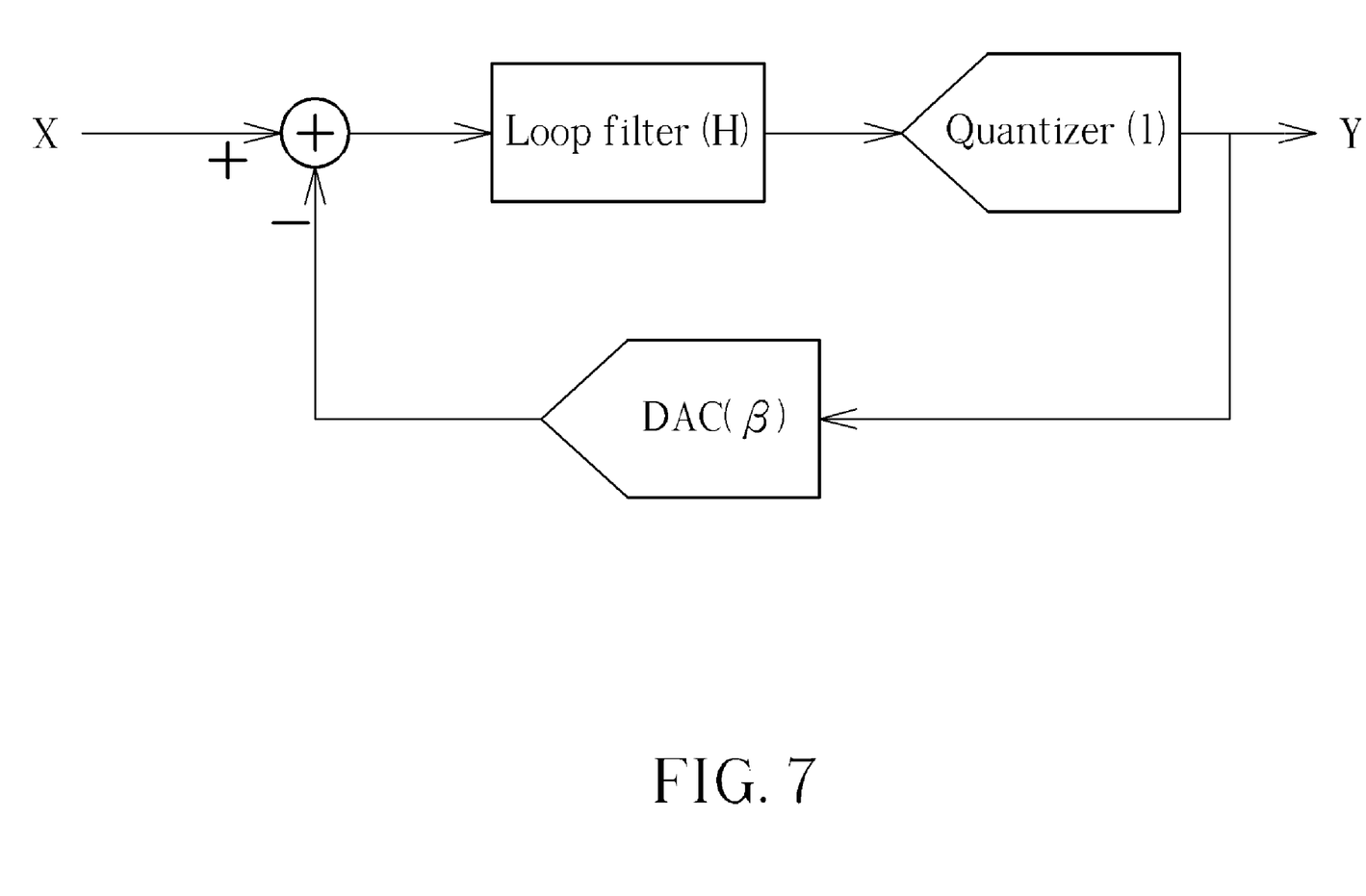
FIG. 7 is a comparison diagram according to a prior art sigma delta modulator and a sigma delta modulator according to an embodiment of the present invention.

FIG. 7 is a diagram which is used for comparing a prior art sigma delta modulator with a sigma delta modulator of the present invention. Via this diagram, the advantage of the present invention is more apparent. In this case, it is assumed the quantizer is ideal, and that quantization noise is ignored. The relation of the output signal Y and the input X can be shown as the following equation:

$$Y = \frac{H}{1+H\beta}X$$

If $H\beta$ is much larger than 1, the relation between the output signal Y and the input signal X can be regarded as $$Y = \frac{1}{\beta}X.$$

Larger Y is desired to allow better signal-to-noise ratio or higher resolution. A larger Y can be obtained by properly adjusting X or $\beta$. In a conventional system, the X value is adjusted to generate the desired result. Since such adjusting mechanism is on the signal path, the linearity of signal will be affected. However, in this invention, $\beta$ value instead of X value is adjusted to generate the same result; since such adjusting mechanism is not on the signal path, the linearity of signal will not be affected.

Those skilled in the art will readily observe that numerous modifications and alterations of the device and method may be made while retaining the teachings of the invention.

What is claimed is:

1. A sigma delta modulator, comprising:
   a loop filter, for filtering a summed signal to generate a filtered signal;
   a single bit quantizer, coupled to the loop filter, for performing a quantization process to the filtered signal to generate a quantized signal;
   a single bit adjustable DAC, coupled to the single bit quantizer, including an adjustable configuration, for generating a feedback signal according to the quantized signal and the configuration; and an adder, coupled to the loop filter and the single bit adjustable DAC, for summing an input signal and the feedback signal to generate the summed signal;
   wherein the single bit adjustable DAC includes a first configuration setting circuit which comprises:
   a resistor;
   a first switch, coupled to the resistor;
   a second switch, coupled to the first switch and a first voltage;
   a third switch, coupled to the first switch and a common voltage; and
   a fourth switch, coupled to the resistor and a second voltage;
   wherein the first switch, the second switch, the third switch and the fourth switch operate according to the quantized signal, and at least one of the resistor, the first voltage, the common voltage and the second voltage is adjustable.

2. The sigma delta modulator of claim 1, wherein the feedback signal of the single bit adjustable DAC is outputted from two differential output terminals, and the single bit adjustable DAC includes a second configuration setting circuit, where the first and the second configuration setting circuits are respectively coupled to the two differential output terminals, and the first and the second configuration setting circuits have the same devices and structures.

3. A sigma delta modulator, comprising:
   a loop filter, for filtering a summed signal to generate a filtered signal;
   a single bit quantizer, coupled to the loop filter, for performing a quantization process to the filtered signal to generate a quantized signal;
   a single bit adjustable DAC, coupled to the single bit quantizer, including an adjustable configuration, for generating a feedback signal according to the quantized signal and the configuration; and
   an adder, coupled to the loop filter and the single bit adjustable DAC, for summing an input signal and the feedback signal to generate the summed signal;
   wherein the single bit adjustable DAC includes a first configuration setting circuit which comprises:
   an output path, coupled to the adder;
   a capacitor;
   a first switch, coupled to the output path and the capacitor;
   a second switch, coupled to a common voltage and the capacitor; and
   a third switch, coupled to the capacitor and a first voltage;
   wherein the first switch, the second switch, and the third switch operate according to the quantized signal, and at least one of the capacitor, the common voltage and the first voltage is adjustable.

4. The sigma delta modulator of claim 3, wherein the feedback signal of the single bit adjustable DAC is outputted from two differential output terminals, and the single bit adjustable DAC includes a second configuration setting circuit, where the first and the second configuration setting circuits are respectively coupled to the two differential output terminals, and the first and the second configuration setting circuits have the same devices and structures.

5. The sigma delta modulator of claim 4, wherein the third switch of the second configuration setting circuit is used for coupling the capacitor of the second configuration setting circuit to a second voltage, and the first voltage and the second voltage have different values.

6. A sigma delta modulator, comprising:
   a loop filter, for filtering a summed signal to generate a filtered signal;
   a single bit quantizer, coupled to the loop filter, for performing a quantization process to the filtered signal to generate a quantized signal;
   a single bit adjustable DAC, coupled to the single bit quantizer, including an adjustable configuration, for generating a feedback signal according to the quantized signal and the configuration; and
   an adder, coupled to the loop filter and the single bit adjustable DAC, for summing an input signal and the feedback signal to generate the summed signal;
   wherein the single bit adjustable DAC includes a first configuration setting circuit which comprises:
      an output path, coupled to the adder;
      an adjustable current source; and
      a switch, coupled to the adjustable current source and the output path, for operating according to the quantized signal.

7. The sigma delta modulator of claim 6, wherein the feedback signal of the single bit adjustable DAC is outputted from two differential output terminals, and the single bit adjustable DAC includes a second configuration setting circuit, where the first and the second configuration setting circuits are respectively coupled to the two differential output terminals, and the first and the second configuration setting circuits have the same devices and structures.

8. The sigma delta modulator of claim 7, wherein the adjustable current source of the second configuration setting circuit has different current values from the adjustable current source of the first configuration setting circuit.

* * * * *